(12) United States Patent
Zhang et al.

(10) Patent No.: US 11,387,339 B2
(45) Date of Patent: Jul. 12, 2022

(54) SEMICONDUCTOR DEVICE AND METHOD FOR MANUFACTURING THE SAME

(71) Applicant: DYNAX SEMICONDUCTOR, INC., Kunshan (CN)

(72) Inventors: Naiqian Zhang, Kunshan (CN); Xi Song, Kunshan (CN); Qingzhao Gu, Kunshan (CN); Xingxing Wu, Kunshan (CN)

(73) Assignee: DYNAX SEMICONDUCTOR, INC., Kunshan (CN)

( * ) Notice: Subject to any disclaimer, the term of this patent is extended or adjusted under 35 U.S.C. 154(b) by 39 days.

(21) Appl. No.: 16/630,582

(22) PCT Filed: Dec. 17, 2018

(86) PCT No.: PCT/CN2018/121450
§ 371 (c)(1),
(2) Date: Jan. 13, 2020

(87) PCT Pub. No.: WO2019/114837
PCT Pub. Date: Jun. 20, 2019

(65) Prior Publication Data
US 2021/0091199 A1   Mar. 25, 2021

(30) Foreign Application Priority Data
Dec. 15, 2017 (CN) .......................... 201711352376.9

(51) Int. Cl.
*H01L 29/423* (2006.01)
*H01L 21/311* (2006.01)
*H01L 29/40* (2006.01)
*H01L 29/66* (2006.01)
*H01L 29/778* (2006.01)

(52) U.S. Cl.
CPC .. *H01L 29/42376* (2013.01); *H01L 21/31144* (2013.01); *H01L 29/401* (2013.01); *H01L 29/66462* (2013.01); *H01L 29/7786* (2013.01)

(58) Field of Classification Search
CPC ............ H01L 29/42376; H01L 29/402; H01L 29/66462; H01L 29/778
USPC ................................ 257/194, 488, 280, 284
See application file for complete search history.

(56) References Cited

U.S. PATENT DOCUMENTS

| | | | | |
|---|---|---|---|---|
| 6,703,678 B2 * | 3/2004 | Hirokawa | ......... | H01L 21/28587 257/280 |
| 6,717,192 B2 * | 4/2004 | Miyoshi | ............ | H01L 29/42316 257/280 |
| 9,640,624 B2 * | 5/2017 | Cheng | ............... | H01L 29/42352 |

\* cited by examiner

*Primary Examiner* — Mark V Prenty
(74) *Attorney, Agent, or Firm* — Armstrong Teasdale LLP

(57) ABSTRACT

The present disclosure provides a semiconductor device and a method for manufacturing the same, and it relates to a field of semiconductor technology. The semiconductor device includes a substrate, a semiconductor layer, a dielectric layer, a source, a drain, and a gate, wherein a first face of the gate close to a side of the drain and close to the semiconductor layer has a first curved face. A gate trench corresponding to the gate is provided on the dielectric layer, a material of the gate being filled in the gate trench, and at least a part of a second face of the gate trench in contact with the gate is a second curved face which extends from a surface of the dielectric layer away from the semiconductor layer toward the semiconductor layer.

17 Claims, 7 Drawing Sheets

SEMICONDUCTOR DEVICE AND METHOD FOR MANUFACTURING THE SAME

CROSS REFERENCE TO RELATED APPLICATIONS

This patent application is a National Stage Entry of PCT/CN2018/121450 filed on Dec. 17, 2018, which claims the benefit and priority of Chinese Patent Application No. 201711352376.9 filed on Dec. 15, 2017, the disclosures of which are incorporated by reference herein in their entirety as part of the present application.

BACKGROUND

The present disclosure relates to a field of semiconductor technology, and particularly relates to a semiconductor device and a method for manufacturing the same.

Due to the significant advantages of the semiconductor material of gallium nitride High Electron Mobility Transistor (HEMT) devices, such as large band gap, high electron saturation drift rate, high breakdown field strength, and high temperature resistance, gallium nitride HEMT devices are suitable for the manufacture of electronic devices of high temperature, high voltage, high frequency and high power, and have broad application prospects. However, the potential gradient of existing gallium nitride devices is not gentle enough.

BRIEF DESCRIPTION

In view of this, embodiments of the present disclosure provide a semiconductor device and a method for manufacturing the same, to solve the problem above.

The present disclosure provides the following technical solutions.

The present disclosure provides a semiconductor device, including a substrate, a semiconductor layer formed at a side of the substrate, and a source and a drain formed at a side of the semiconductor layer away from the substrate, and a gate between the source and the drain, wherein at least a part of a first face of the gate close to the drain and close to the semiconductor layer has a first curved face.

Further, the first face of the gate further includes a first plane which extends from the first curved face to the semiconductor layer.

Further, a ratio of a length of the first plane to a total length of the first face of the gate is X, and $0 \leq X \leq 0.95$.

Further, a ratio of a length of a projection of the total length of the first face of the gate in the plane of the semiconductor layer to a vertical distance from the first face of the gate to a plane of the bottom of the gate is Y, and $0.3 \leq Y \leq 7$.

Further, the first curved face of the gate includes a third plane at a side away from the semiconductor layer.

Further, the semiconductor device further includes a dielectric layer formed at a side of the semiconductor layer away from the substrate between the source and the drain, and the gate is formed at a side of the dielectric layer away from the semiconductor layer; a gate trench corresponding to the gate is provided on the dielectric layer, a material of the gate being filled in the gate trench and covering the gate trench, and at least a part of a second face of the gate trench in contact with an end of gate close to the drain has a second curved face which extends from a surface of the dielectric layer away from the semiconductor layer toward the semiconductor layer.

Further, the second face of the gate trench further includes a second plane at a side close to the semiconductor layer.

Further, the second curved face extends from a surface of the dielectric layer away from the semiconductor layer to the semiconductor layer.

Further, the gate trench penetrates the dielectric layer and extends into the semiconductor layer.

Further, at least a part of a third face of the gate at a side close to the source and close to the semiconductor layer has the first curved face, and/or at least a part of a fourth face of the gate trench in contact with an end of the gate close to the source has the second curved face.

Further, an angle between the first plane and the semiconductor layer is greater than or equal to 25° and less than or equal to 85°.

Further, an angle between the second plane and the semiconductor layer is greater than or equal to 25° and less than or equal to 85°.

The present disclosure further provides a method for manufacturing a semiconductor device, including providing a substrate, forming a semiconductor layer at a side of the substrate, forming a source and a drain at a side of the semiconductor layer away from the substrate, and forming a gate at a side of the semiconductor layer away from the substrate between the source and the drain, at least a part of a first face of the gate close to the drain and close to the semiconductor layer has a first curved face.

Further, the step of forming a gate at a side of the semiconductor layer away from the substrate between the source and drain includes forming a dielectric layer at a side of the semiconductor layer away from the substrate between the source and the drain, forming a gate trench for forming the gate on the dielectric layer, so that at least a part of a second face of the gate trench in contact with an end of the gate close to the drain is a second curved face corresponding to the first curved face, the second curved face extending from the surface of the dielectric layer away from the semiconductor layer toward the semiconductor layer, and forming the gate based on the dielectric layer, the gate being formed based on the gate trench and located between the source and the drain.

Further, at least a part of a fourth face of the gate trench in contact with an end of the gate close to the source is the second curved face.

Further, the step of forming a gate trench for forming the gate on the dielectric layer includes covering a mask at a side of the dielectric layer away from the semiconductor layer, performing a first-stage etching on the mask and the dielectric layer at a region corresponding to the gate trench, so that the second face of the gate trench forms a plane, baking the semiconductor device after the first-stage etching, so that the mask forms the second curved face at a face close to the gate trench, performing a second-stage etching on the interface between the dielectric layer and the mask, so that the second face of the gate trench forms the second curved face, and performing a third-stage etching by using the dielectric layer as a mask after the dielectric layer is etched to remove a part of the semiconductor layer corresponding to the bottom of the gate trench.

In embodiments of the present disclosure, with such a semiconductor device structure, the presence of the first curved face of the gate can make the potential gradient of the semiconductor device gentler. Further, the second curved face of the gate trench structure can make the potential gradient at the top corner of the gate trench become gentler under the same drain voltage condition, which thus reduces the peak electric field strength at the position, and the position of the peak electric field at one end of the bottom of the gate trench close to the drain can also be introduced into the semiconductor layer material. Since the breakdown voltage of the semiconductor layer material is higher than the breakdown voltage of the dielectric layer, the withstandable peak electric field strength is increased there. The combination of the two is actually equivalent to an increase in the area of the depletion region, thereby increasing the electric field strength of the entire gate region. The integral of the electric field strength is the breakdown voltage; therefore, the gate and gate trench structure actually increases the breakdown voltage of the device. And the arc-shaped second curved face can increase the bonding force between the dielectric layer and the metal, so that the gate is less likely to fall off, and the reliability of the device is improved.

To make the features and advantages of the present disclosure more manifest and understandable, example embodiments will be described in detail in conjunction with the appending drawings.

BRIEF DESCRIPTION OF THE DRAWINGS

In order to illustrate the technical solutions of the embodiments of the present disclosure more clearly, drawings to be used in the embodiments will be briefly described below. It should be appreciated that the following drawings illustrate only certain embodiments of the present disclosure, and thus they should not be seen as limiting the scope. Other relevant drawings may also be obtained by those skilled in the art according to these drawings without exercise of inventive skills.

DETAILED DESCRIPTION

Figure 1:
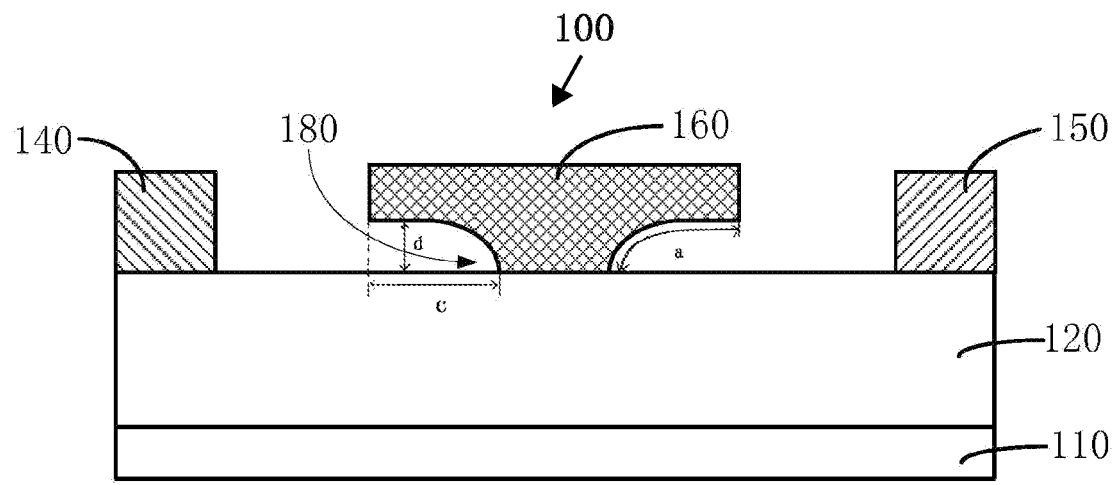
FIG. 1 is a schematic diagram of a semiconductor device according to an embodiment of the present disclosure.

The technical solutions of the embodiments of the present disclosure will be clearly and completely described in the following with reference to the accompanying drawings. Obviously, the described embodiments are only a part, other than all, of the embodiments of the disclosure. The components of the embodiments of the disclosure, which are described and illustrated in the drawings herein, may generally be arranged and designed in various different configurations. Therefore, the following detailed description of the embodiments of the disclosure in the drawings is not intended to limit the scope of the present disclosure, but merely refers to example embodiments of the present disclosure. All other embodiments obtained by those skilled in the art based on the embodiments of the present disclosure without exercise of inventive skills are within the scope of the present disclosure.

It should be noted that similar reference numerals and letters indicate similar items in the following drawings. Therefore, once an item is defined in a drawing, it is not necessary to further define or explain it in the subsequent drawings.

The inventors have found that, in the manufacture process of a gallium nitride device, an inclined field plate structure of a gate can be prepared. Such a structure is generally prepared by forming an inclined gate trench by etching, and evaporating metal on the inclined gate trench to form a gate electrode. Compared with a structure in which no gate trench is provided, setting the inclined gate trench facilitates modulating the channel electric field by the gate and reducing the peak electric field at a side of the gate trench bottom close to the drain, thereby increasing the breakdown voltage of the device and reducing the current collapse effect. However, in such a gate trench structure, there is still a problem that the potential gradient is not gentle enough and a peak electric field exists. The inventors have found that a conventional gate has a corner at which a peak electric field can be formed. When the drain voltage increases, the peak electric field formed there does not make the potential gradient here gentle, thereby limiting the width of the depletion region and reducing the breakdown voltage of the device. Moreover, at the corner of the dielectric layer, the bonding force thereof with metal is poor, which results in poor reliability of the device. In view of this, an embodiment of the present disclosure provides a semiconductor device 100, as shown in FIG. 1, the semiconductor device 100 includes a substrate 110, a semiconductor layer 120, a source 140, a drain 150, and a gate 160.

The substrate 110 may be one of sapphire, silicon carbide, silicon, gallium arsenide, gallium nitride, or aluminum nitride.

The semiconductor layer 120 is formed at a side of the substrate 110, and the source 140 and the drain 150 are formed at a side of the semiconductor layer 120 away from the substrate 110. The gate 160 is formed at a side of the semiconductor layer 120 away from the substrate 110. Specifically, in the embodiment of the present disclosure, at least a part of a first face of the gate 160 close to the drain 150 and close to the semiconductor layer 120 has a first curved face 180. Optionally, the first curved face 180 of the gate 160 may extend from the surface of the gate 160 close to the semiconductor layer 120 toward the semiconductor layer 120, the length of the first curved face 180 in the first direction from the source to the drain shown in FIG. 1 is a. In order to reduce the problem of peak electric field at the gate corner, optionally, the first face of the gate 160 further includes a first plane which extends from the first curved face to the semiconductor layer, the length thereof in the first direction is b, a+b is the total length of the first face of the gate 160, b/(a+b) is the value of X, $0 \leq X \leq 0.95$; the length ratio which has a better effect of reducing the leakage current is $0.15 \leq X \leq 0.81$. In order to make the potential gradient of the semiconductor device become gentler and improve the overall performance of the device, optionally, c is a projection of the total length a+b of the first face of the gate 160 on a plane of the semiconductor layer 120, d is the maximum vertical distance from the first face of the gate 160 to the plane of the bottom of the gate, c/d is the value of Y, $0.3 \leq Y \leq 7$; the range of optimizing the overall performance of the device is $0.7 \leq Y \leq 4$. Optionally, the first curved face 180 of the gate 160 further has a partial plane at a side away from the semiconductor layer 120, which is a third plane, and the plane extends toward the electrode. One first curved face 180 at one end close to the source 140 and one first curved face 180 at one end close to the drain 150 may be formed for the gate 160.

Figure 2:
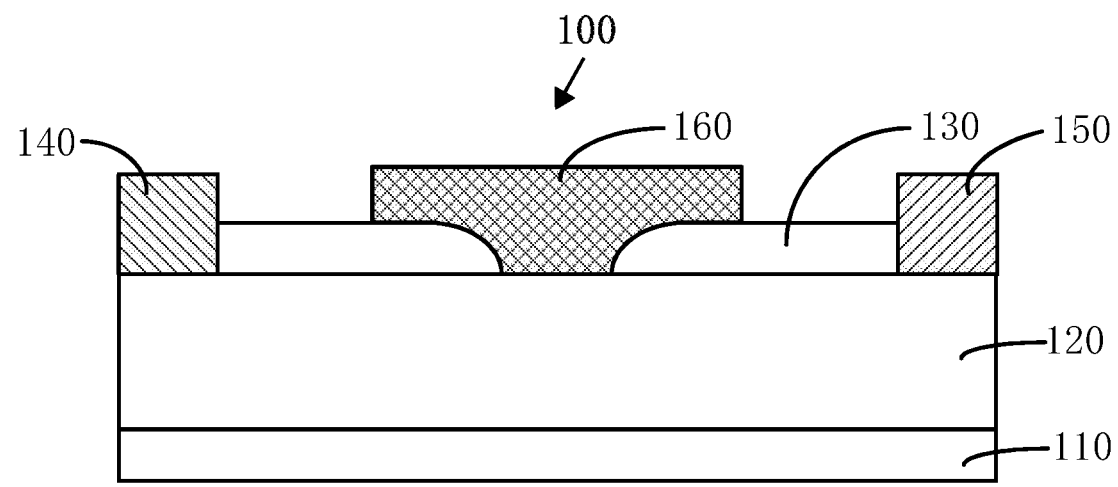
FIG. 2 is a schematic diagram of another semiconductor device according to an embodiment of the present disclosure.

In a specific embodiment of the present disclosure, as shown in FIG. 2, in order to form the first curved face 180 of the gate 160, the semiconductor device 100 may further include a dielectric layer 130 at a side of the semiconductor layer 120 away from the substrate 110, the dielectric layer 130 being formed at a side of the semiconductor layer 120 away from the substrate 110 and located between the source 140 and the drain 150.

The dielectric layer 130 functions as a passivation layer, and the dielectric layer 130 may be one or a combination of more of SiN, $SiO_2$, SiON, $Al_2O_3$, $HfO_2$, and $HfAlO_x$.

Figure 3:
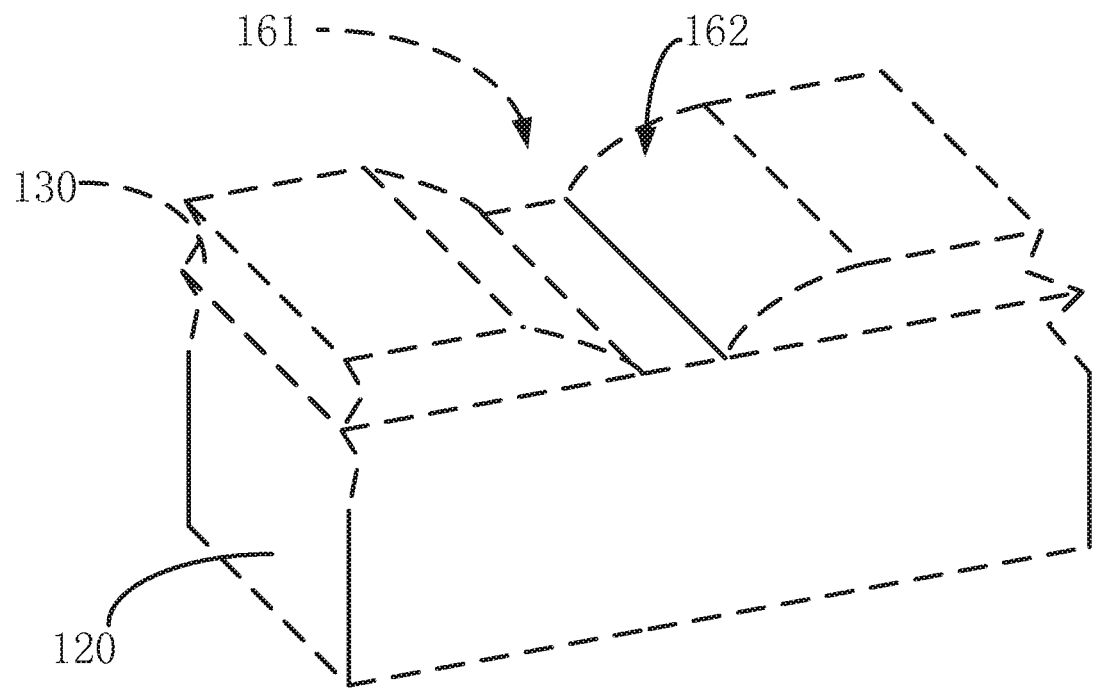
FIG. 3 is a perspective structural schematic diagram of a gate trench portion of a semiconductor device according to an embodiment of the present disclosure.
Figure 4:
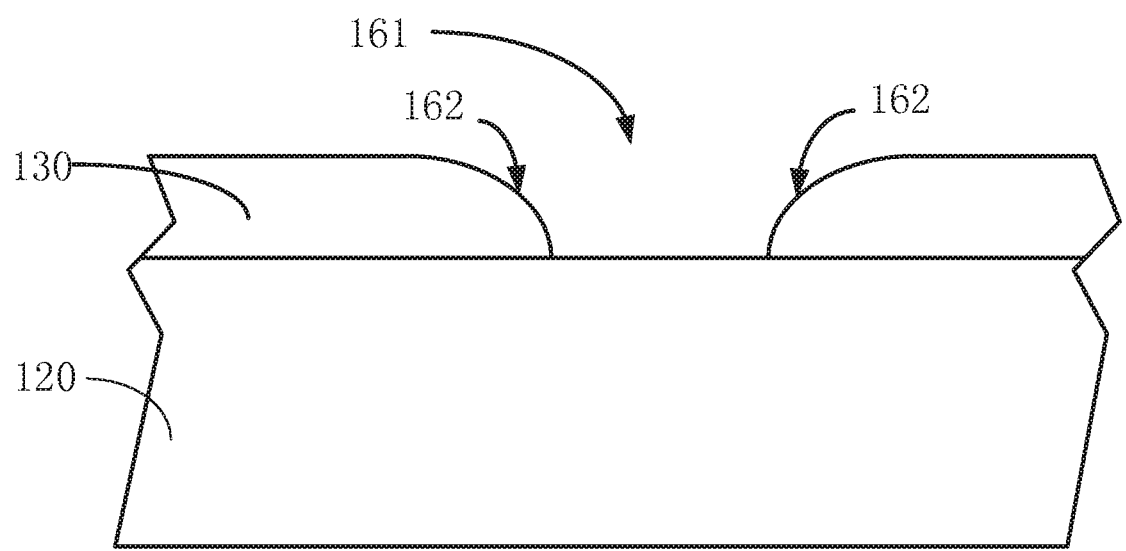
FIG. 4 is a schematic cross-sectional diagram of a gate trench portion of a semiconductor device according to an embodiment of the present disclosure.

As shown in FIG. 3 and FIG. 4, a gate trench 161 corresponding to the gate 160 is provided on the dielectric layer 130. The material of the gate 160 is filled in the gate trench 161, and at least a part of the second face of the gate trench 161 in contact with an end of the gate 160 close to the drain 150 forms a second curved face 162, and the second curved face 162 extends from the surface of the dielectric layer 130 away from the semiconductor layer 120 toward the semiconductor layer 120. For the sake of clarity, the electrode structure of the gate 160 is not shown in FIGS. 3 and 4.

In the embodiments of the present disclosure, with such a semiconductor device structure, the presence of the first curved face of the gate can make the potential gradient of the semiconductor device gentler. Further, in the embodiment of the present disclosure, with such a gate trench structure above, the second curved face 162 can make the potential gradient at the top corner of the gate trench 161 become gentler under the same drain voltage condition, which thus reduces the peak electric field strength at the position, and by removing partial material barrier layer at the bottom of the gate trench, the position of the peak electric field at one end of the bottom of the gate trench 161 close to the drain 150 can also be introduced into the material, since the breakdown voltage of the material is higher than that of the dielectric layer, thereby increasing the withstandable peak electric field strength there. The combination of the two is actually equivalent to an increase in the area of the depletion region, thereby increasing the electric field strength of the entire gate trench region. The integral of the electric field strength is the breakdown voltage; therefore, the gate trench structure actually increases the breakdown voltage of the device. And the arc-shaped second curved face can increase the bonding force between the dielectric layer and the metal, so that the gate 160 is less likely to fall off, and the reliability of the device is improved.

Figure 8A:
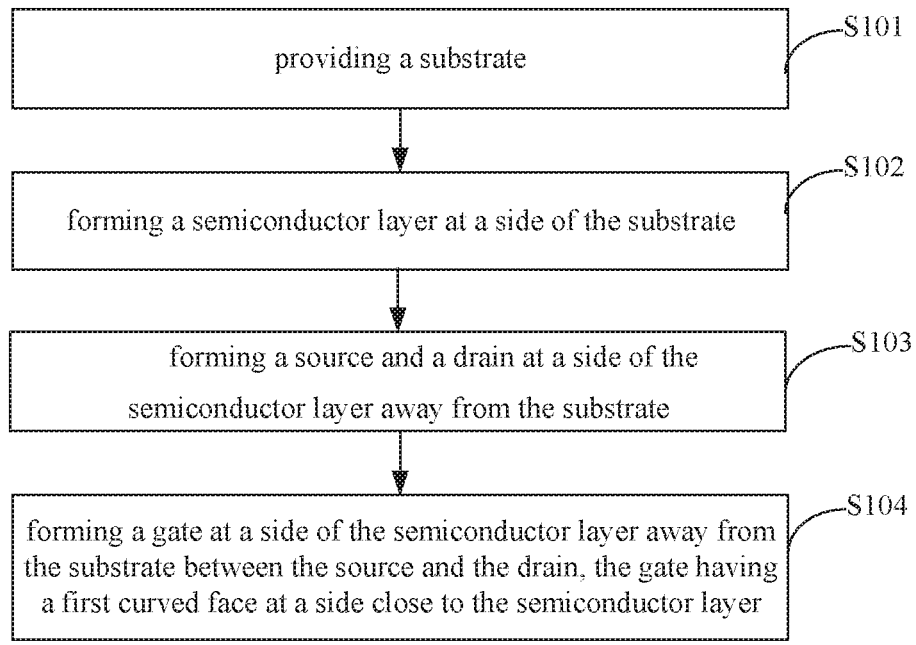
FIG. 8A is a flow chart of a method for manufacturing a semiconductor device according to an embodiment of the present disclosure.
Figure 8B:
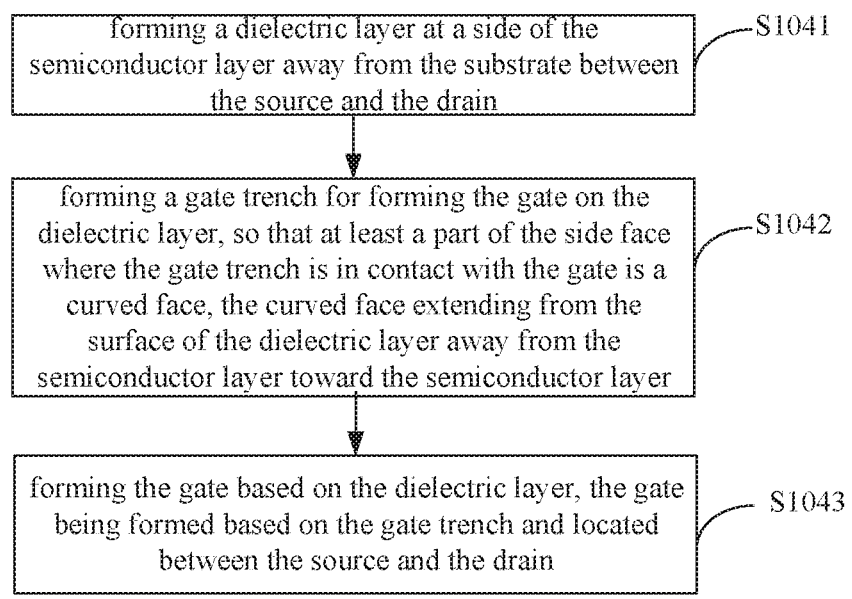
FIG. 8B is a step flow chart of step S140 in FIG. 8A.

The shape of the gate 160 matches that of the gate trench 161, and the first curved face 180 of the gate 160 may be formed on a surface in contact with the second curved face 162. The gate 160 may be a T-shaped gate structure, and the gate trench 161 may be formed in a region corresponding to the gate 160 on the dielectric layer 130 through a photolithography mask 170 (as shown in FIGS. 8A and 8B), and two layers of Ni/Au metal are evaporated in the gate trench 161 by electron beam evaporation technique, thereby forming the gate 160. In other embodiments, the gate 160 may have other structures, and is not limited to the T-shaped gate structure in the embodiment of the present disclosure, as long as the first curved face 180 can be formed.

Specifically, in a specific embodiment, as shown in FIG. 3, at least a part of the second face of the gate trench 161 in contact with an end of the gate 160 close to the drain 150 forms the second curved face 162. Optionally, the second curved face 162 may extend from the surface of the dielectric layer 130 away from the semiconductor layer 120 to the semiconductor layer 120. Thus, the second face of the gate trench 161 close to the drain 150 is entirely curved.

In another specific embodiment, at least a part of a fourth face of gate trench 161 in contact with an end of the gate 160 close to the source 140 also form the second curved face 162. Optionally, the second curved face 162 may extend from the surface of the dielectric layer 130 away from the semiconductor layer 120 to the semiconductor layer 120. Thus, the fourth face of the gate trench 161 close to the source 140 is entirely curved.

It should be appreciated that, in the gate trench 161, it is possible that only the second face in contact with one end of the drain 150 may have the second curved face 162, while the fourth surface in contact with one end of the source 140 has no second curved face 162. In addition, the gate trench 161 may also be formed such that two faces in contact with the gate 160 have the second curved face 162.

Figure 5:
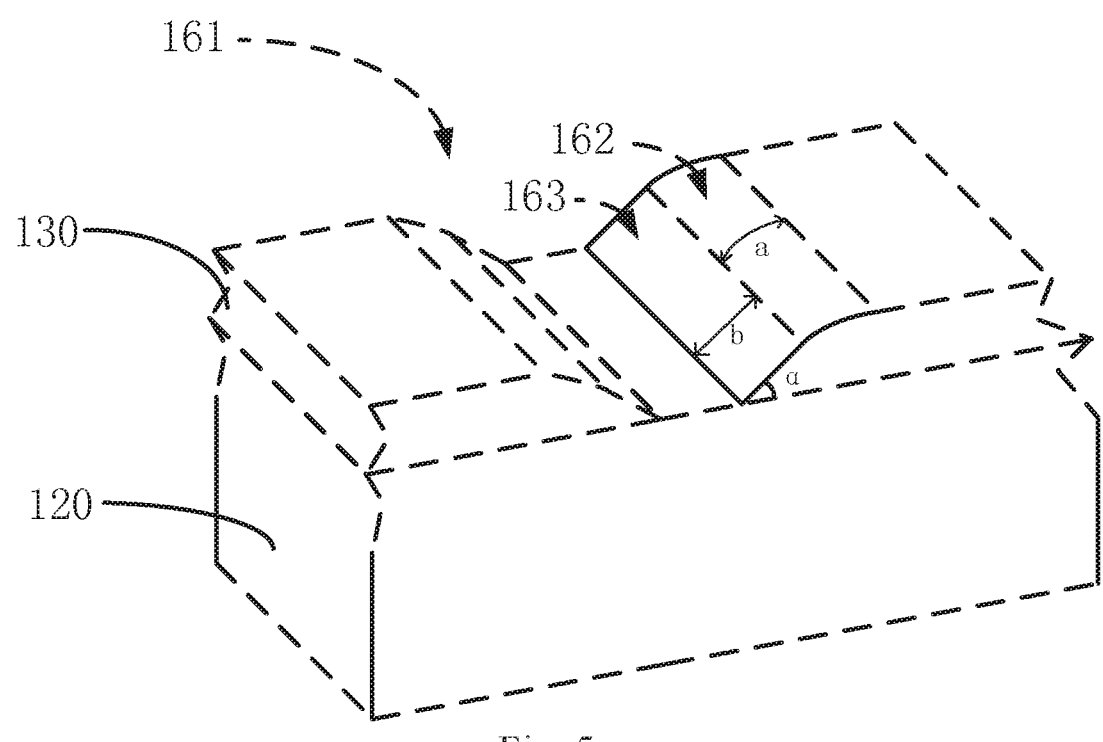
FIG. 5 is another perspective structural schematic diagram of a gate trench portion of a semiconductor device according to an embodiment of the present disclosure.

In an example, as shown in FIG. 5, the two faces of the gate trench 161 in contact with the gate 160 include a part of the second curved face 162 and a part of the second plane 163 that forms an angle with the semiconductor layer 120, the second curved face 162 extends from the surface of the dielectric layer 130 away from the semiconductor layer 120 toward the semiconductor layer 120, and the second plane 163 extends from the second curved face 162 to the semiconductor layer 120. Thus, the two faces of the gate trench 161 are composed of two parts, one part being the second curved face 162, while the other part being the second plane 163, the second curved face 162 does not extend to the bottom of the gate trench 161. One part of the shape of the face where the gate 160 is in contact with the gate trench is the second curved face 162, while the other part is the second plane 163.

Correspondingly, the first face and the third face of the gate 160 in contact with the gate trench 161 may also include a part of the first curved face 180 and a part of the first plane forming an angle with the semiconductor layer 120 and corresponding to the second plane, the first curved face 180 may start to extend from a surface at one side of the gate 160 close to the semiconductor layer 120 towards the semiconductor layer 120 to a position of the first plane, and then the first plane extends from the first curved face 180 to the semiconductor layer 120.

In order to modulate the two-dimensional electron gas concentration under the gate trench and reduce the overall leakage current of the device, the ratio of the length of the second plane 163 in the first direction to the total length of the second face of the gate trench 161 is X, where $0 \leq X \leq 0.95$; the length ratio which has a better effect of reducing the leakage current may be $0.15 \leq X \leq 0.81$. When X=0.5, the length of the second plane 163 is equal to that of the second curved face 162. As shown in FIG. 5, the length of the second curved face 162 may be a, and the length of the second plane 163 is b, where b>=0; when b=0, all of the second face of the gate trench is a curved face. a+b is the total length of the second face of the gate trench 161, and b/(a+b) is the value of X. In FIG. 5, the angle between the second plane 163 and the plane of the semiconductor layer 120 is α. The angle between the second plane 163 and the plane of the semiconductor layer 120 is greater than or equal to 25° and less than or equal to 85°, and may be greater than or equal to 29° and less than or equal to 61°. Correspondingly, in the gate 160, the relationship between the length of the first plane and the length of the first curved face corresponds to the relationship between the second plane 163 and the second curved face 162 in the gate trench 161.

Figure 6:
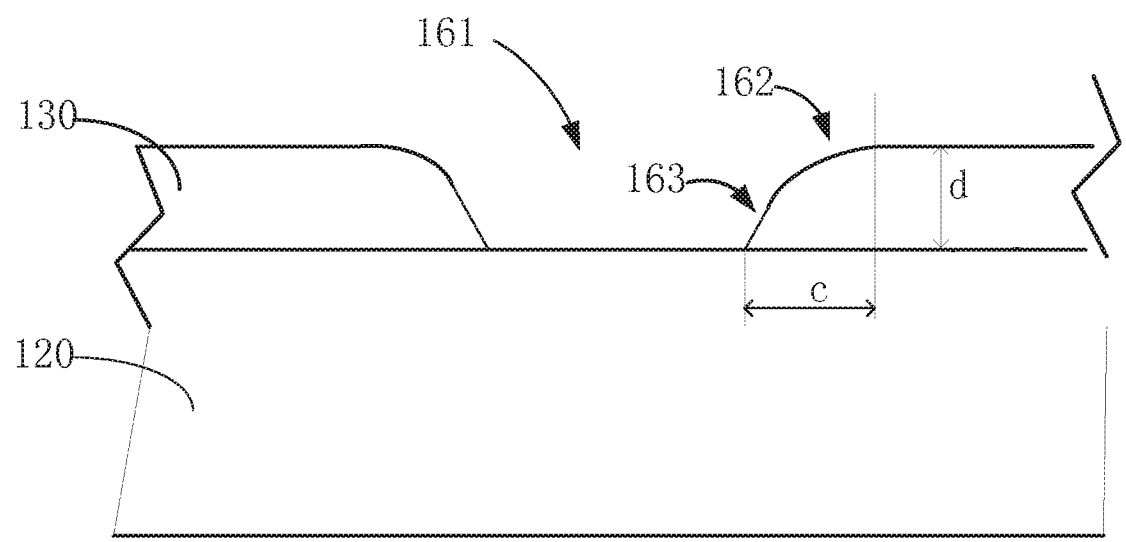
FIG. 6 is another schematic cross-sectional diagram of a gate trench portion of a semiconductor device according to an embodiment of the present disclosure.

In an embodiment, at least a part of the fourth face where the gate trench 161 is in contact with one end of the gate 160 close to the source 140 also has the second curved face 162 which extends from the surface of the dielectric layer 130 away from the semiconductor layer 120 toward the semiconductor layer 120. In order to further modulate the two-dimensional electron gas under the side of the trench, and reduce the device leakage current, in FIG. 6, the length of the projection of the second face where the gate trench is in contact with the gate on the plane of the dielectric layer 130 is c, the thickness of the dielectric layer 130 is d, and c/d is the value of Y, the ratio of the length of the projection of the second face where the gate trench is in contact with the gate on the plane of the dielectric layer 130 to the thickness of the dielectric layer 130 is Y, where $0.3 \leq Y \leq 7$. The ratio of the length of the projection of the second face where the gate trench is in contact with the gate on the plane of the dielectric layer 130 to the thickness of the dielectric layer 130 may be $0.7 \leq Y \leq 4$; when Y=1, the length of the projection of the second face where the gate trench is in contact with the gate on the plane of the dielectric layer 130 is equal to the thickness of the dielectric layer 130; when Y=1.5, the length of the projection of the second face where the gate trench is in contact with the gate on the plane of the dielectric layer 130 is 1.5 times the thickness of the dielectric layer 130; when Y=3, the length of the projection of the second face where the gate trench is in contact with the gate on the plane of the dielectric layer 130 is 3 times the thickness of the dielectric layer 130.

Figure 7:
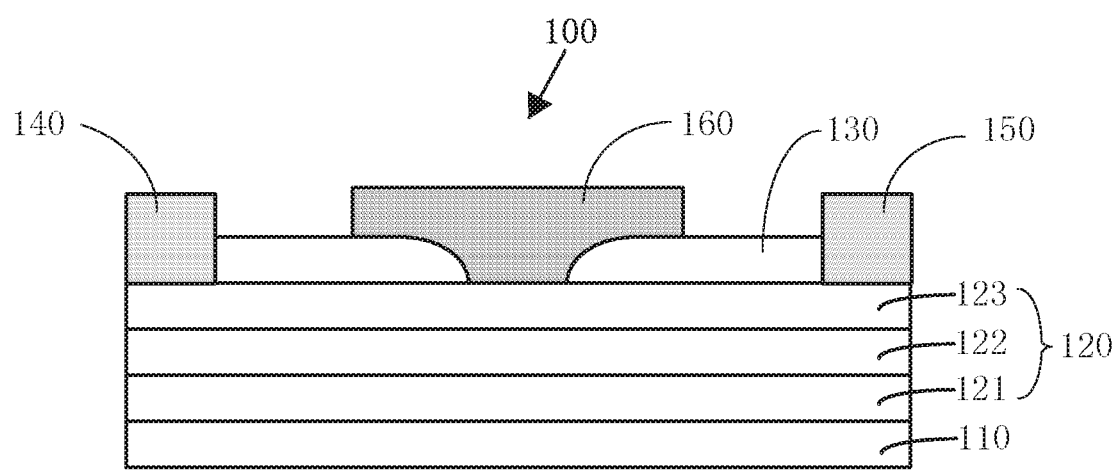
FIG. 7 is another schematic diagram of a semiconductor device according to an embodiment of the present disclosure.

As shown in FIG. 7, in a specific embodiment of the present disclosure, the semiconductor layer 120 may include a buffer layer 121, a channel layer 122, and a barrier layer 123.

The buffer layer 121 is formed at a side of the substrate 110. The channel layer 122 is formed at a side of the buffer layer 121 away from the substrate 110. The barrier layer 123 is formed at a side of the channel layer 122 away from the buffer layer 121, and the dielectric layer 130 is formed at a side of the barrier layer 123 away from the channel layer 122.

The buffer layer 121 may be a gallium nitride material, and the degree of lattice matching of the buffer layer 121 with the substrate 110 would affect parameters such as the crystal quality, surface topography, and electrical properties of the buffer layer 121 per se, and may also affect parameters such as the crystal quality, surface topography, and electrical properties of other materials at a side of the buffer layer 121 away from the substrate 110. The buffer layer 121 may have a thickness between 2 μm and 4 μm. The buffer layer 121 may further include a nucleation layer, and the total thickness thereof may be less than or equal to 5 μm. The main ingredient of the nucleation layer may be a gallium nitride material, and elements such as Al, In, P, Si, Fe, C and etc. may be doped in the nucleation layer to achieve the purpose of matching the substrate material. In addition, a layer of gallium nitride buffer layer may be grown on the gallium nitride nucleation layer, and the gallium nitride buffer layer is an undoped layer.

The channel layer 122 is a gallium nitride material layer having a better lattice quality formed on the basis of the buffer layer 121.

The barrier layer 123 may be of an aluminum gallium nitride material, and the barrier layer 123 and the channel layer 122 may form a heterostructure, and a large amount of two-dimensional electron gas may be formed at a boundary of the heterostructure under the piezoelectric effect. The aluminum content in the barrier layer 123 may be between 20% and 30%, and the thickness of the barrier layer 123 may be between 10 and 50 nm.

In an example, the gate trench 161 may also penetrate the dielectric layer 130 and extend into the semiconductor layer 120. Specifically, the gate trench 161 may penetrate the dielectric layer 130 and extend into the interior of the barrier layer 123 such that the depth of the gate trench 161 is greater than the thickness of the dielectric layer 130. Thus, the position of the peak electric field at an end of the bottom of the gate trench 161 close to the drain 150 may be introduced into the interior of the semiconductor layer material. Since the breakdown voltage of the semiconductor layer material is higher than the breakdown voltage of the dielectric layer material, the withstandable peak electric field strength there may be increased.

An embodiment of the present disclosure further provides a method for manufacturing a semiconductor device 100, as shown in FIG. 8A, including the following steps.

Step S101, providing a substrate 110.

Step S102, forming a semiconductor layer 120 at a side of the substrate 110. In the embodiment, the semiconductor layer 120 includes a buffer layer 121, a channel layer 122, and a barrier layer 123.

Step S103, forming a source 140 and a drain 150 at a side of the semiconductor layer 120 away from the substrate 110.

The source 140 and the drain 150 may be formed by evaporating a plurality of layers of metal such as Ti, Al, Ni, or Au by electron beam evaporation, and then the metal in the non-active region is then stripped by a method of organic solution stripping, and then the metal is brought into ohmic contact with the material in the semiconductor layer 120 by a rapid annealing technique.

Step S104, forming a gate 160 at a side of the semiconductor layer 120 away from the substrate 110 between the source 140 and the drain 150, the gate 160 having a first curved face at a side close to the semiconductor layer 120.

Specifically, in the embodiment, as shown in FIG. 8B, the step S104 includes the following steps S1041 to S1043, which will be described in detail below.

Step S1041, forming a dielectric layer 130 at a side of the semiconductor layer 120 away from the substrate 110 between the source 140 and the drain 150.

The dielectric layer 130 may be grown in situ in an MOCVD cavity, or may be grown by LPCVD, ALD, or PECVD.

Step S1042, forming a gate trench 161 for forming the gate 160 on the dielectric layer 130, so that at least a part of the second face where the gate trench 161 is in contact with the gate 160 is a second curved face 162, the second curved face 162 extending from the surface of the dielectric layer 130 away from the semiconductor layer 120 toward the semiconductor layer 120.

Figure 9:
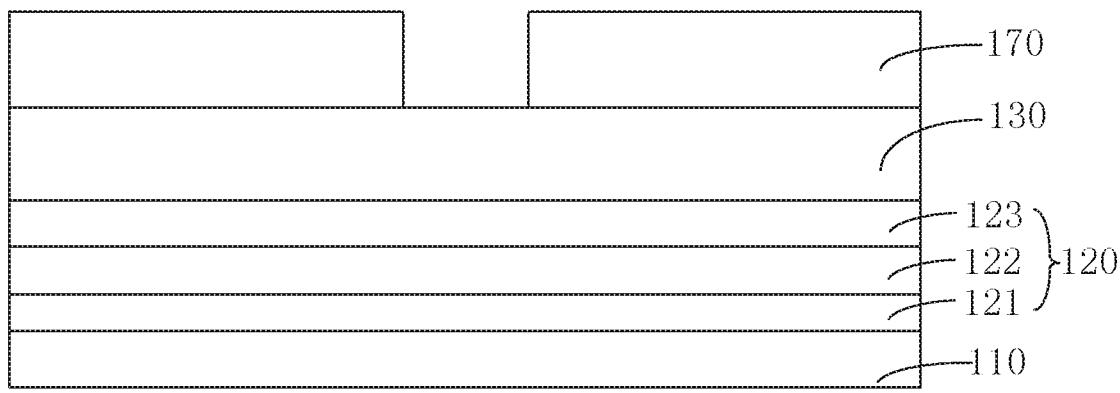
FIG. 9 to FIG. 13 are schematic cross-sectional structural diagrams corresponding to respective steps in the manufacture of a gate trench in the method for manufacturing a semiconductor device according to an embodiment of the present disclosure.
Figure 10:
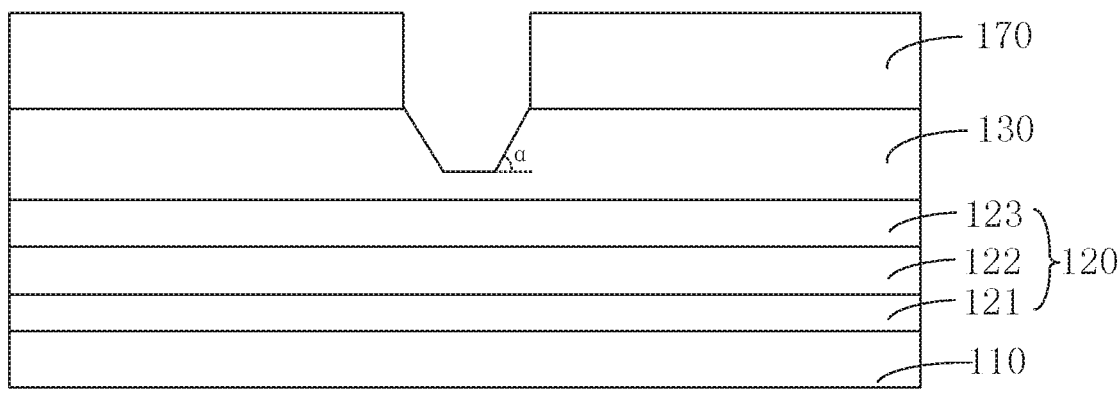

After the deposition of the dielectric layer 130 is completed, a mask 170 may be covered at a side of the dielectric layer 130 away from the semiconductor layer 120. Then, the mask 170 and the dielectric layer 130 of the region corresponding to the gate trench 161 are etched. As shown in FIG. 9, the dielectric within the gate trench 161 is etched after the photolithographic mask 170 is completed. For instance, one of plasma etching devices such as RIE (Reactive Ion Etching), ECR (Electron Cyclontron Resonance), or ICP (Inductively Coupled Plasma) may be used, and the process gas used for the etching may include one or a combination of $SF_6$, $CF_4$, $CHF_3$, $N_2$, $O_2$, and Ar. During the plasma etch phase, the dielectric within gate trench 161 is not completely etched. The etching depth can be determined according to the ratio of the length of the smooth straight line to the total length of the sidewall of the entire gate trench 161, as shown in FIG. 10. The angle α between the sidewall of the etched gate trench 161 and the plane of the dielectric layer 130 after etching may be 29° to 61°.

Figure 11:
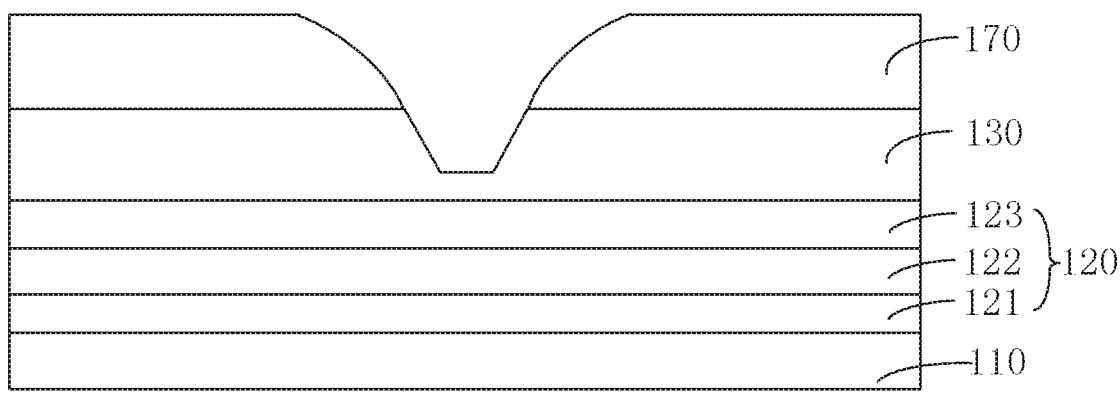

After etching, baking is performed to make the mask 170 above the dielectric layer 130 form a curved topography. The baking may be done using a heating stage or a baking oven. The baking temperature may be 110 to 160° C., and the baking time may be 5 minutes. After baking, the photoresist mask 170 becomes inclined and the bottom has a curved topography. FIG. 11 shows the topography of the mask 170 after baking, and the morphology of the mask 170 may be controlled by controlling the temperature of the baking.

Figure 12:
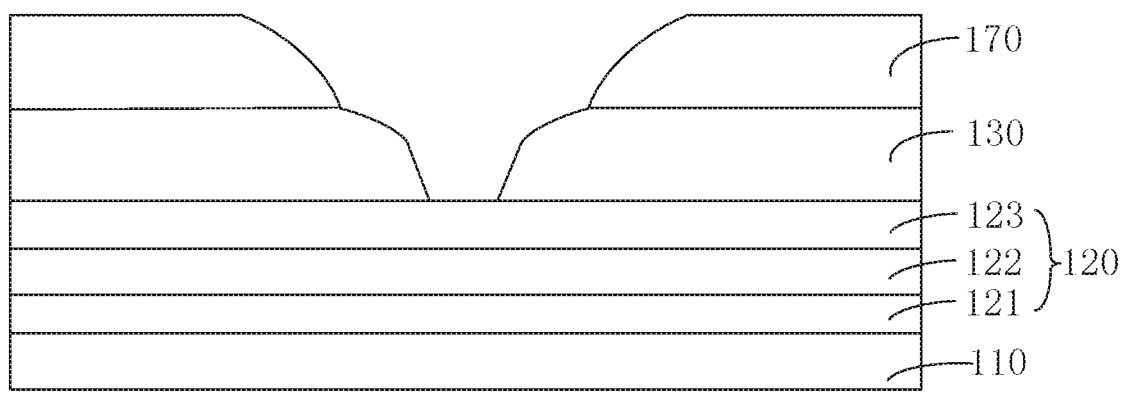

After the baking is completed, the second-stage etching is then performed at the interface where the dielectric layer 130 is in contact with the mask 170, due to the difference in etching rate of the dielectric layer 130 blocked by the mask 170 of the curved portion in the etching process of the second-stage, a curved topography may be formed at the top corner of the gate trench 161. Thus, the morphology of the photoresist mask 170 after the second-stage etching is transferred to the top corner of the gate trench 161, as shown in FIG. 12.

Figure 13:
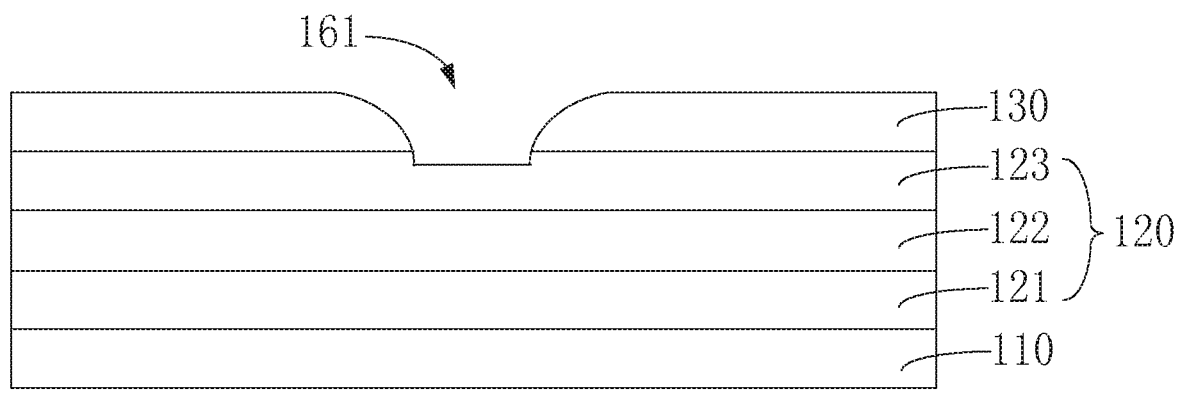

In the embodiment, as shown in FIG. 13, after the second-stage etching is completed, the dielectric layer 130 may also be used as a mask to perform a third-stage etching, so that a part of the barrier layer 123 of the semiconductor layer 120 is etched away while the mask 170 is removed, such that the gate trench 161 extends to the barrier layer 123. Thus, the position of the peak electric field at one end of the bottom of the gate trench 161 close to the drain 150 may be introduced into the material. Since the breakdown voltage of the semiconductor layer material is higher than the breakdown voltage of the dielectric layer material, the withstandable peak electric field strength there can be increased.

Step S1043, forming the gate 160 based on the dielectric layer 130, the gate 160 being formed based on the gate trench 161 and located between the source 140 and the drain 150.

After the manufacture of the gate trench 161 is completed, the gate 160 may be manufactured. Since the gate trench 161 has a curved portion, the formed gate also correspondingly forms a curved face, that is, the first curved face, in a portion in contact with the curved portion.

It should be noted that the manufacturing method for the semiconductor device shown in FIGS. 8A and 8B firstly forms the corresponding topography of the dielectric layer and then forms the corresponding topography of the gate correspondingly. It may be appreciated that, in other embodiments, the topography of the dielectric layer may not be formed first, and the topography of the gate may be directly formed in other methods, so that the gate is formed with a first curved face at a side close to the semiconductor layer.

It should also be noted that in the description of the present disclosure, unless specified or limited otherwise, the terms "set", "mounted", "connected", and "coupled" are used broadly, and may be, for example, fixed connections, detachable connections, or integral connections, may also be mechanical or electrical connections, may also be direct connections or indirect connections via intervening structures, may also be inner communications of two elements. Those skilled in the art can understand the specific meaning of the above terms in the present disclosure as the case may be.

It should be noted that similar reference numerals and letters indicate similar items in the following drawings. Therefore, once an item is defined in a drawing, it is not necessary to further define and explain it in the subsequent drawings.

In the description of the present disclosure, it should be noted that the orientation or positional relationship indicated by the terms such as "central", "upper", "lower", "left", "right", "vertical", "horizontal", "inner", and "outer" is based on the orientation or positional relationship shown in the drawings, or the orientation or positional relationship conventionally placed when the product of the present disclosure is used. The terms are only for the convenience of describing the present disclosure and simplifying the description, instead of indicating or implying that the device or component referred to must have a particular orientation, constructed and operated in a particular orientation, so they are not to be construed as limiting the disclosure. Moreover, the terms "first", "second", "third" etc. are used merely for distinction in the description, and they are not to be construed as indicating or implying a relative importance.

The above description refers only to preferred embodiments of the present disclosure, and is not intended to limit the present disclosure. For those skilled in the art, various modifications and changes can be made to the present disclosure. Any modifications, equivalent substitutions, improvements, etc. made within the spirit and scope of the present disclosure are intended to be included within the scope of the present disclosure.

What is claimed is:

1. A semiconductor device comprising:
   a substrate;
   a semiconductor layer formed at a side of the substrate; and
   a source and a drain formed at a side of the semiconductor layer opposite the substrate, and a gate between the source and the drain, wherein at least a part of a first face of the gate close to a side of the drain and close to the semiconductor layer has a first curved face, wherein the first face of the gate further comprises a first plane which extends from the first curved face to the semiconductor layer, and wherein an angle between the first plane and the semiconductor layer is greater than or equal to 25° and less than or equal to 85°.

2. The semiconductor device according to claim 1, wherein a ratio of a length of the first plane to a total length of the first face of the gate is X, and wherein 0≤X≤0.95.

3. The semiconductor device according to claim 1, wherein a ratio of a length of a projection of a total length of the first face of the gate in a plane of the semiconductor layer to a vertical distance from the first face of the gate to a plane of a bottom of the gate is Y, and wherein 0.3≤Y≤7.

4. The semiconductor device according to claim 1, wherein the first curved face of the gate comprises a second plane at a side away from the semiconductor layer.

5. The semiconductor device according to claim 1, wherein the semiconductor device further comprises a dielectric layer formed at the side of the semiconductor layer opposite the substrate between the source and the drain, and wherein the gate is formed at a side of the dielectric layer away from the semiconductor layer;
wherein a gate trench corresponding to the gate is provided on the dielectric layer, wherein a material of the gate is filled in the gate trench and covering the gate trench, and wherein at least a part of a first face of the gate trench in contact with an end of the gate close to the drain has a first curved face which extends from a surface of the dielectric layer away from the semiconductor layer toward the semiconductor layer.

6. The semiconductor device according to claim 5, wherein the first face of the gate trench further comprises a first plane at a side close to the semiconductor layer.

7. The semiconductor device according to claim 5, wherein the first curved face of the gate trench extends from the surface of the dielectric layer opposite the semiconductor layer to the semiconductor layer.

8. The semiconductor device according to claim 5, wherein the gate trench penetrates the dielectric layer and extends into the semiconductor layer.

9. The semiconductor device according to claim 5, wherein at least a part of a second face of the gate at a side close to the source and close to the semiconductor layer has the first curved face of the gate, and/or wherein at least a part of a second face of the gate trench in contact with an end of the gate close to the source has the first curved face of the gate trench.

10. The semiconductor device according to claim 6, wherein an angle between the first plane of the gate trench and the semiconductor layer is greater than or equal to 25° and less than or equal to 85°.

11. A method for manufacturing a semiconductor device, the method comprising:
providing a substrate;
forming a semiconductor layer at a side of the substrate;
forming a source and a drain at a side of the semiconductor layer opposite the substrate; and
forming a gate at the side of the semiconductor layer opposite the substrate between the source and the drain, at least a part of a first face of the gate close to the drain and close to the semiconductor layer has a first curved face, and the first face of the gate further comprises a first plane which extends from the first curved face to the semiconductor layer, wherein an angle between the first plane and the semiconductor layer is greater than or equal to 25° and less than or equal to 85°.

12. The method according to claim 11, wherein the step of forming a gate at the side of the semiconductor layer opposite the substrate between the source and drain comprises:
forming a dielectric layer at the side of the semiconductor layer opposite the substrate between the source and the drain;
forming a gate trench for forming the gate on the dielectric layer, so that at least a part of a first face of the gate trench in contact with an end of the gate close to the drain is a first curved face of the gate trench corresponding to the first curved face of the gate, the first curved face of the gate trench extending from a surface of the dielectric layer opposite the semiconductor layer toward the semiconductor layer; and
forming the gate based on the dielectric layer, the gate formed based on the gate trench and located between the source and the drain.

13. The method according to claim 12, wherein at least a part of a second face of the gate trench in contact with an end of the gate close to the source is the first curved face of the gate trench.

14. The method according to claim 12, wherein the step of forming a gate trench for forming the gate on the dielectric layer comprises:
covering a mask at a side of the dielectric layer opposite the semiconductor layer;
performing a first-stage etching on the mask and the dielectric layer at a region corresponding to the gate trench, so that the first face of the gate trench forms a plane;
baking the semiconductor device after the first-stage etching, so that the mask forms the first curved face of the gate trench at a face close to the gate trench;
performing a second-stage etching on an interface between the dielectric layer and the mask, so that the first face of the gate trench forms the first curved face of the gate trench; and
performing a third-stage etching by using the dielectric layer as a mask after the dielectric layer is etched to remove a part of the semiconductor layer corresponding to a bottom of the gate trench.

15. The semiconductor device according to claim 2, wherein a ratio of a length of a projection of the total length of the first face of the gate in a plane of the semiconductor layer to a vertical distance from the first face of the gate to a plane of a bottom of the gate is Y, and wherein $0.3 \leq Y \leq 7$.

16. The semiconductor device according to claim 6, wherein the gate trench penetrates the dielectric layer and extends into the semiconductor layer.

17. The method according to claim 13, wherein the step of forming a gate trench for forming the gate on the dielectric layer comprises:
covering a mask at a side of the dielectric layer opposite the semiconductor layer;
performing a first-stage etching on the mask and the dielectric layer at a region corresponding to the gate trench, so that the first face of the gate trench forms a plane;
baking the semiconductor device after the first-stage etching, so that the mask forms the first curved face of the gate trench at a face close to the gate trench;
performing a second-stage etching on an interface between the dielectric layer and the mask, so that the first face of the gate trench forms the first curved face of the gate trench; and
performing a third-stage etching by using the dielectric layer as a mask after the dielectric layer is etched to remove a part of the semiconductor layer corresponding to a bottom of the gate trench.

* * * * *